US012437974B2

(12) United States Patent
Panchangam et al.

(10) Patent No.: US 12,437,974 B2
(45) Date of Patent: Oct. 7, 2025

(54) SOLENOID BANK WITH STANDBY SOLENOID VALVES FOR CONTROLLING PNEUMATIC VALVES OF A SUBSTRATE PROCESSING SYSTEM

(71) Applicant: LAM RESEARCH CORPORATION, Fremont, CA (US)

(72) Inventors: Swajeeth Pilot Panchangam, Bangalore (IN); Vinayakaraddy Gulabal, Yadgir (IN); Yeshwanth Saghi, Bangalore (IN); Keerthi Gowdaru, Bengaluru (IN)

(73) Assignee: LAM RESEARCH CORPORATION, Fremont, CA (US)

( * ) Notice: Subject to any disclaimer, the term of this patent is extended or adjusted under 35 U.S.C. 154(b) by 435 days.

(21) Appl. No.: 18/020,302

(22) PCT Filed: Aug. 17, 2021

(86) PCT No.: PCT/US2021/046277
§ 371 (c)(1),
(2) Date: Feb. 8, 2023

(87) PCT Pub. No.: WO2022/040166
PCT Pub. Date: Feb. 24, 2022

(65) Prior Publication Data

US 2023/0274915 A1 Aug. 31, 2023

Related U.S. Application Data

(60) Provisional application No. 63/068,439, filed on Aug. 21, 2020.

(51) Int. Cl.
*H01J 37/32* (2006.01)
*C23C 16/455* (2006.01)

(52) U.S. Cl.
CPC .. *H01J 37/32449* (2013.01); *C23C 16/45544* (2013.01); *C23C 16/45561* (2013.01)

(58) Field of Classification Search
CPC ......... H01J 37/32449; C23C 16/45544; C23C 16/45561
(Continued)

(56) References Cited

U.S. PATENT DOCUMENTS 6,604,555 B2 * 8/2003 Blatt .......................... F17C 5/00 141/1
10,132,001 B2 11/2018 Takahashi et al.
(Continued)

FOREIGN PATENT DOCUMENTS

KR 1020040012306 A 2/2004
KR 1020080025575 A 3/2008
KR 1020080026852 A 3/2008

OTHER PUBLICATIONS

International Search Report and Written Opinion of the ISA issued in PCT/US2021/046277, mailed Dec. 9, 2021; ISA/KR.
(Continued)

*Primary Examiner* — Parviz Hassanzadeh

(57) ABSTRACT

A fluid control system for a substrate processing system includes (M+N) inlets configured to fluidly connect to (M) solenoid valves and (N) standby solenoid valves, respectively, where (M) and (N) are integers greater than zero. (M) outputs are configured to be fluidly connected to (M) pneumatic valves. A valve switching system is configured to selectively block (1) to (N) of the M inlets corresponding to (1) to (N) failed ones of (M) solenoid valves, respectively, and supply fluid from (1) to (N) of the (N) standby solenoid valves to (1) to (N) of the (M) outputs corresponding to the (1) to (N) failed ones of (M) solenoid valves, respectively.

20 Claims, 7 Drawing Sheets

(58) Field of Classification Search
USPC .................................................... 156/345.33
See application file for complete search history.

(56) References Cited

U.S. PATENT DOCUMENTS

| | | | | |
|---|---|---|---|---|
| 2012/0221193 | A1 | 8/2012 | Delaye et al. | |
| 2019/0368041 | A1 | 12/2019 | Sreeram et al. | |
| 2020/0208783 | A1* | 7/2020 | Lim | F17C 13/023 |

OTHER PUBLICATIONS

Masoud Aminian, et al., "A Proposed Genetic Algorithm to Optimize Service Restoration in Electrical Networks With Respect to the Probability of Transformers Failure", 2010 IEEE International Conference on Power and Energy (PECon2010), Nov. 29-Dec. 1, 2010, Kuala Lumpur, Malaysia.

Wikipedia, "V6 engine", https://en.wikipedia.org/wiki/V6_engine, retrieved on Feb. 1, 2023.

Reliawiki, "Markov Diagrams", https://reliawiki.org/index.php/Markov_Diagrams, retrieved on Feb. 1, 2023.

* cited by examiner

FIG. 3
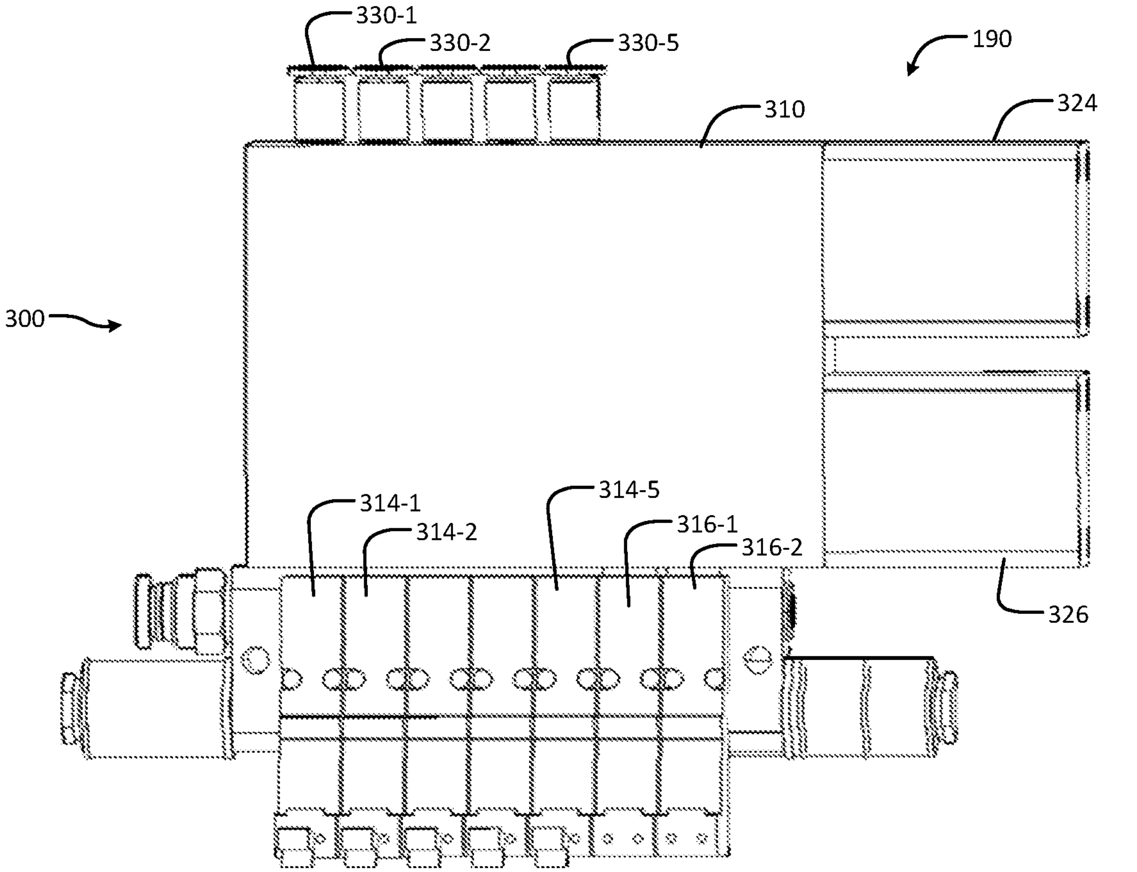
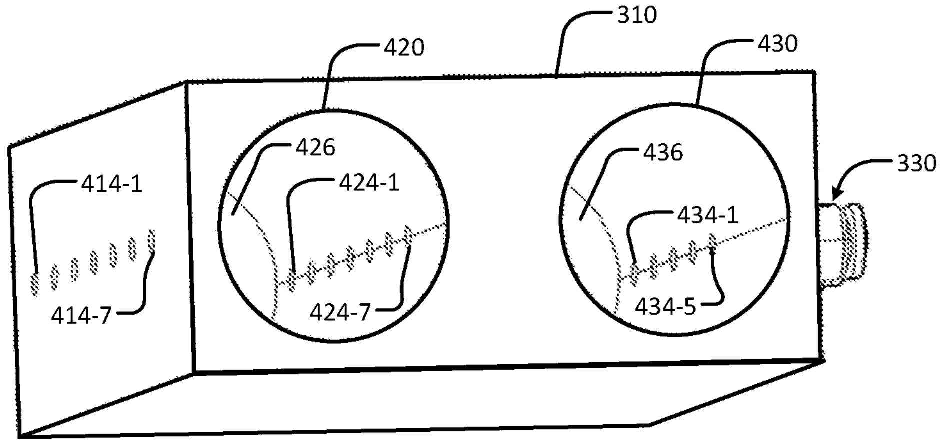
FIG. 4

SOLENOID BANK WITH STANDBY SOLENOID VALVES FOR CONTROLLING PNEUMATIC VALVES OF A SUBSTRATE PROCESSING SYSTEM

CROSS-REFERENCE TO RELATED APPLICATIONS

This application is a U.S. National Phase Application under 35 U.S.C. 371 of International Application No. PCT/US2021/046277, filed on Aug. 17, 2021, which claims the benefit of U.S. Provisional Application No. 63/068,439, filed on Aug. 21, 2020. The entire disclosures of the applications referenced above are incorporated herein by reference.

FIELD

The present disclosure relates to substrate processing systems and more particularly to a solenoid bank with standby valves to control pneumatic valves supplying process gases to the substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Process gas mixtures may be supplied to the processing chamber to treat the substrate. Plasma may be used to ignite the gases to enhance chemical reactions.

When depositing film using atomic layer deposition (ALD), the substrate is exposed to a precursor gas mixture. The processing chamber is purged and the substrate is exposed to a reactant gas mixture to convert the precursor. Then, the processing chamber is purged again. Deposition during each cycle is generally limited to a monolayer of film. In other applications, the film is deposited using plasma-enhanced atomic layer deposition (PEALD). Each PEALD cycle typically includes a precursor dose, a dose purge, an RF plasma dose, and an RF purge step.

During each stage, different gas mixtures may be delivered to the processing chamber using a showerhead or other gas distribution device. Because each ALD cycle deposits a monolayer of film, the ALD cycles are repeated very quickly to deposit film having a desired thickness. This means that the valves controlling the precursor, reactant and/or purge gases need to be opened and closed rapidly. Solenoid valves are often used to supply an inert gas to pneumatically actuate valves controlling the precursor, reactant and/or purge gases. Due to the high number of cycles and fast switching times, the solenoid valves tend to fail and require frequent replacement.

SUMMARY

A fluid control system for a substrate processing system comprises (M+N) inlets configured to fluidly connect to M solenoid valves and N standby solenoid valves, respectively, where M and N are integers greater than zero. M outputs are configured to be fluidly connected to M pneumatic valves. A valve switching system is configured to selectively block 1 to N of the M inlets corresponding to 1 to N failed ones of M solenoid valves, respectively, and supply fluid from 1 to N of the N standby solenoid valves to 1 to N of the M outputs corresponding to the 1 to N failed ones of M solenoid valves, respectively.

In other features, an enclosure including N cavities in fluid communication with the (M+N) inlets and the M outputs. N shafts are arranged in the N cavities. Each of the N shafts comprises a cylindrical body including first shaft portions having a first diameter and second shaft portions having a second diameter, a cavity extending in an axial direction, and M bores extending outwardly from the cavity to at least one of the first shaft portions at M different angles.

In other features, N motors selectively rotate the N shafts. M sealing rings are arranged on the at least one of the first shaft portions at spaced axial locations corresponding to the M bores, respectively.

In other features, each of the M sealing rings comprises an annular body and first and second annular projections extending radially outwardly on opposite axial sides of the annular body and configured to seal with an inner surface of one of the N cavities. Each of the M sealing rings further comprises a blocking portion extending axially between the first and second annular projections and a bore extending radially through the blocking portion. A central cavity extends around a radially outer surface of the annular body between the first and second annular projections and between opposite circumferential sides of the blocking portion.

In other features, the bore of each of the M sealing rings is axially aligned with corresponding ones of the M bores. N blocking rings are arranged at spaced axial locations on other ones of the first shaft portions. Each of the N shafts further comprises a bore on at least one of the second shaft portions between adjacent ones of the first shaft portions. The bore is fluidly coupled to the cavity of each of the N shafts.

In other features, a controller configured to monitor operation of the M solenoid valves, determine when one of the M solenoid valves is not operating correctly, and cause at least one of the N motors to rotate at least one of the N shafts to block fluid flow from the one of the M solenoid valves and supply fluid flow from one of the N standby solenoid valves.

A method for switching pneumatic valves in a substrate processing system comprises connecting (M+N) inlets of a solenoid bank switching system to M solenoid valves and N standby solenoid valves, respectively, where M and N are integers greater than zero; connecting M outlets of the solenoid bank switching system to M pneumatic valves; monitoring operation of the M solenoid valves; and in response to detecting one of the M solenoid valves has failed, using the solenoid bank switching system to cause one of N motors of the solenoid bank switching system to rotate one of N shafts of the solenoid bank switching system to: block one of the (M+N) inputs corresponding to the failed one of the M solenoid valves; and fluidly connect one of the N standby solenoid valves to one of the M outlets corresponding to the failed one of the M solenoid valves.

A system comprises (M+N) inlets configured to fluidly connect to M solenoid valves and N standby solenoid valves, respectively, where M and N are integers greater than zero. The system comprises M outputs configured to be fluidly connected to M pneumatic valves. The system comprises a valve switching system configured to selectively block 1 to N of the M inlets corresponding to 1 to N failed ones of M solenoid valves, respectively; and to supply fluid from 1 to N of the N standby solenoid valves to 1 to N of the M outputs corresponding to the 1 to N failed ones of M solenoid valves, respectively. The system comprises an enclosure including N cavities in fluid communication with the (M+N) inlets and the M outputs; N shafts arranged in the N cavities; and N motors to selective rotate the N shafts, respectively.

In other features, each of the N shafts comprises a cylindrical body including first shaft portions having a first diameter and second shaft portions having a second diameter; a cavity extending in an axial direction; and M bores extending outwardly from the cavity to at least one of the first shaft portions at M different angles.

In other features, the system further comprises M sealing rings arranged on the at least one of the first shaft portions at spaced axial locations corresponding to the M bores, respectively. Rach of the M sealing rings comprises an annular body; and first and second annular projections extending radially outwardly on opposite axial sides of the annular body and configured to seal with an inner surface of one of the N cavities.

In other features, each of the M sealing rings further comprises a blocking portion extending axially between the first and second annular projections; a bore extending radially through the blocking portion; and a central cavity extending around a radially outer surface of the annular body between the first and second annular projections and between opposite circumferential sides of the blocking portion.

In other features, the bore of each of the M sealing rings is axially aligned with corresponding ones of the M bores.

In other features, the system further comprising N blocking rings arranged at spaced axial locations on other ones of the first shaft portions.

In other features, each of the N shafts further comprises a bore on at least one of the second shaft portions between adjacent ones of the first shaft portions; and the bore is fluidly coupled to the cavity of each of the N shafts.

In other features, the system further comprising a controller configured to monitor operation of the M solenoid valves; determine when one of the M solenoid valves is not operating correctly; and cause at least one of the N motors to rotate at least one of the N shafts to block fluid flow from the one of the M solenoid valves and supply fluid flow from one of the N standby solenoid valves.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a plan view of an example of the solenoid bank switching system for the gas delivery system according to the present disclosure;

FIG. 4 is a perspective view of an example of an enclosure of the solenoid bank switching system according to the present disclosure;

In the drawings, reference numbers may be reused to identify similar and/or identical elements.

DETAILED DESCRIPTION

A solenoid bank switching system according to the present disclosure includes M solenoid switches and N standby solenoid switches, where M and N are integers greater than zero. When one of the M solenoid switches fails, the solenoid bank switching system replaces the failed one of the M solenoid switches with one of the N standby solenoid switches. As a result, the substrate processing system can continue to operate without downtime despite the failure of the one to N of the M solenoid switches.

Figure 1:
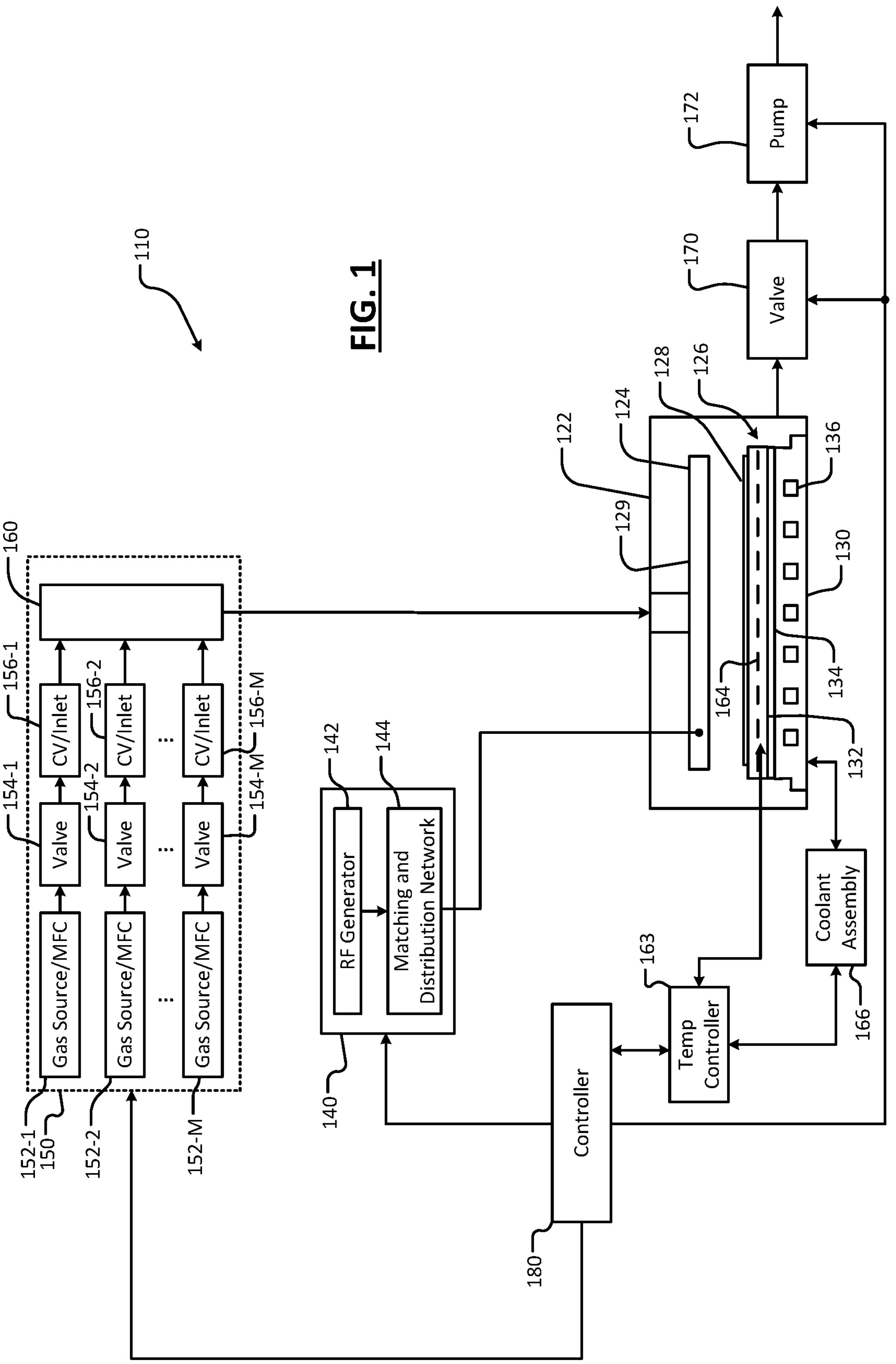
FIG. 1 is a functional block diagram of an example of a substrate processing system including a solenoid bank switching system according to the present disclosure.

While the solenoid bank switching system according to the present disclosure will be described in the context of a substrate processing system performing ALD or PEALD, the solenoid bank switching system can be used to control fluid flow in a variety of other types of substrate processing systems or in other systems unrelated to substrate processing systems. For example, the solenoid bank switching system can be used for atomic layer etch (ALE). Referring now to FIG. 1, an example of a substrate processing system 110 for performing ALD or PEALD is shown. The substrate processing system 110 may be used to perform ALD with or without striking plasma. If plasma is used, the plasma can be struck using capacitively coupled plasma (CCP), although inductively coupled plasma (ICP) or other suitable methods may be used.

The substrate processing system 110 includes a processing chamber 122 that encloses other components of the substrate processing system 110 and contains the RF plasma (if used). The substrate processing system 110 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. An annular body is generally cylindrical and extends radially outwardly from an opposite end of the stem portion at a location that is spaced from the top surface of the processing chamber. A substrate-facing surface or faceplate of the annular body of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A bonding and/or a thermal resistance layer 134 may be arranged between the heating plate 132 and the baseplate 130. The baseplate 130 may include one or more channels 136 for flowing coolant through the baseplate 130.

An RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF plasma power that is fed by a matching and distribution network 144 to the upper electrode 124 or the baseplate 130. In other examples, the plasma may be generated inductively or remotely.

A gas delivery system 150 includes one or more gas sources/mass flow controllers (MFCs) 152-1, 152-2, . . . , and 152-M (collectively gas sources/MFCs 152), where M is an integer greater than zero. The gas sources/MFCs 152 are connected by pneumatic valves 154-1, 154-2, . . . , and 154-M (collectively valves 154) and charge volumes/inlets 156-1, 156-2, . . . , and 156-M (collectively charge volumes/inlets 156) to a manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 110. As will be described further below, a solenoid bank switching system 190 includes solenoid valves and standby solenoid valves. When one of the solenoid valves fails, the solenoid bank switching system disconnects the failed solenoid valve and connects one of the standby solenoid valves.

Figure 2:
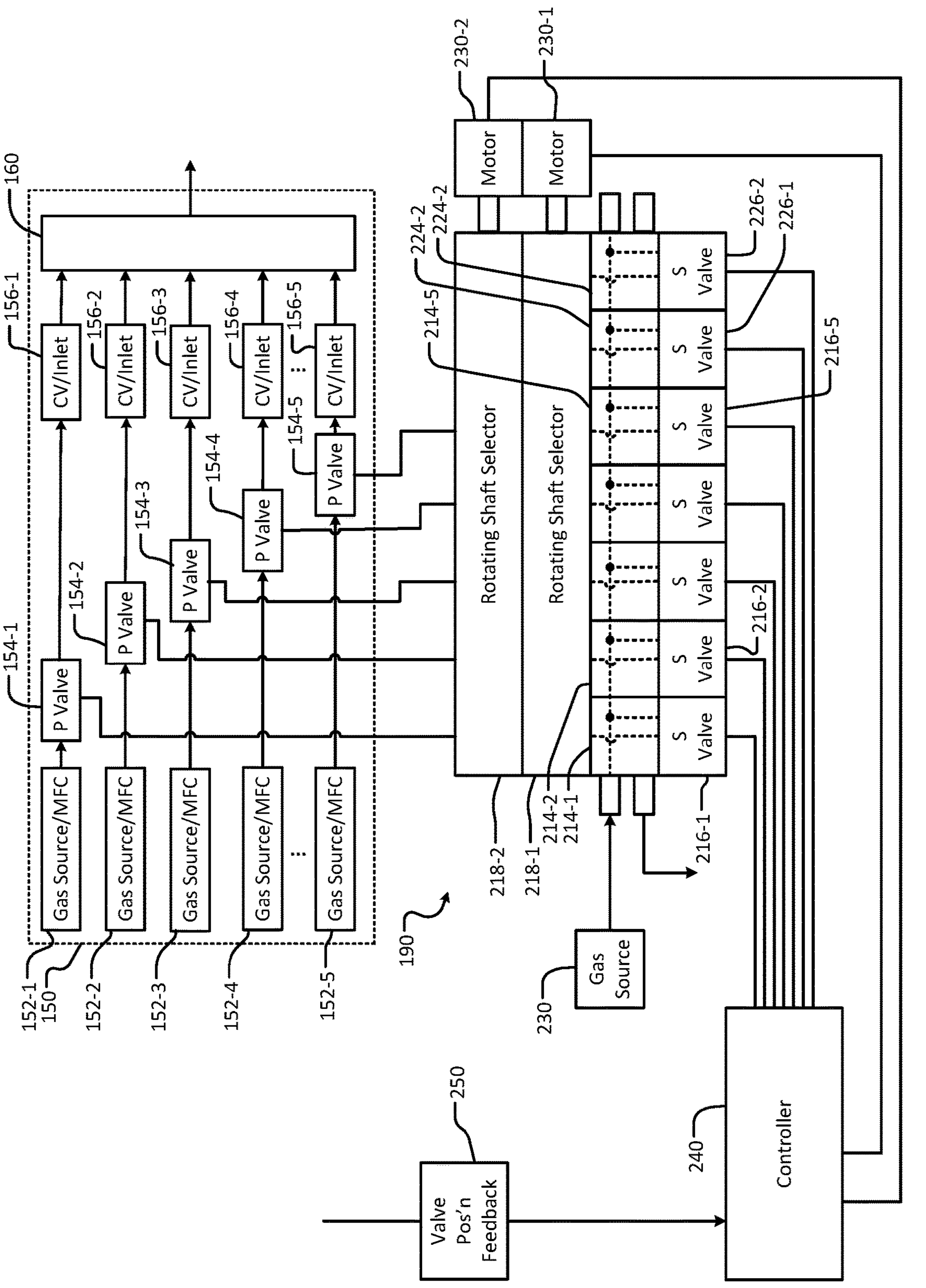
FIG. 2 is a functional block diagram of an example of the solenoid bank switching system for a gas delivery system according to the present disclosure.

Referring now to FIG. 2, a solenoid bank switching system 190 for a gas delivery system is shown. The solenoid bank switching system includes M solenoid valves and N standby solenoid valves where M and N are integers greater than zero. While the foregoing description relates to a solenoid bank switching system 190 with M=5 solenoid valves and N=2 standby solenoid valves, additional or fewer solenoid valves and/or standby solenoid valves can be used.

Manifold blocks 214-1, 214-2, . . . , and 214-5 are arranged between solenoid valves 216-1, 216-2, . . . , and 216-5 (collectively solenoid valves 216) and a first rotating shaft selector 218-1). Manifold blocks 224-1 and 224-2 (collectively manifold blocks 224) are arranged between standby solenoid valves 226-1 and 216-2 (collectively standby solenoid valves 226) and the first rotating shaft selector 218-1. A second rotating shaft selector 218-2 is arranged adjacent to the first rotating shaft selector 218-1.

Each of the rotating shaft selectors 218-1 and 218-2 (collectively rotating shaft selectors 218) is rotated by a corresponding motor 230-1 and 230-2 (collectively motors 230). Fluid outputs of the second rotating shaft selector 218-2 are connected to control inputs of pneumatic valves 154-1, 154-2, . . . , and 154-5 (collectively pneumatic valves 154). In this example, the pneumatic valves 154 are arranged between the gas sources/MFCs 152-1, 152-2, . . . , and 152-5 and charge volumes/inlets 156-1, 156-2, . . . 156-5.

Outputs of the solenoid valves 216 and the standby solenoid valves 226 are used to switch the pneumatic valves 154 between open and closed states. The following example assumes that the solenoid valve 216-2 fails first and then the solenoid valve 216-1 fails later. When the solenoid valve 216-2 is not operating correctly, the rotating shaft selector 218-1 blocks the output of the failed solenoid valve 216-2 and connects an output of the standby solenoid valve 226-1 to supply fluid to control the corresponding one of the pneumatic valves 154-2. When the solenoid valve 216-1 is not operating correctly, the rotating shaft selector 218-2 blocks the output of the failed solenoid valve 216-1 and connects an output of the standby solenoid valve 226-2 to supply fluid to control the corresponding one of the pneumatic valves 154-1.

A controller 240 (which may be standalone or combined with the controller 180) controls operation of the solenoid valves 216 and the standby solenoid valves 226. The controller 240 receives valve position feedback and diagnoses operation of the solenoid valves 216. For examples, failure may be indicated when the MFCs 156 sense flow when the corresponding pneumatic valve 154 should be closed and/or when the MFCs do not sense flow when the corresponding pneumatic valve should be open. Alternately, position sensors can be used to sense states of the pneumatic valves.

Referring now to FIG. 3, the solenoid bank switching system 190 is shown in further detail. The solenoid bank switching system 190 includes an enclosure 310 housing a valve switching system 300. Solenoid valve/manifold assemblies 314-1, 314-2, . . . , and 314-5 and standby solenoid valve/manifold assemblies 316-1, 316-2, . . . , and 316-5 are arranged along a first side of the enclosure 310. The solenoid bank switching system 190 includes motors 324 and 326 that are arranged along a second side of the enclosure 310. Outputs 330-1, 330-2, . . . , and 330-5 (collectively outputs 330) of the enclosure 310 are arranged on a third side (opposite to the first side) of the enclosure 310.

Referring now to FIG. 4, the enclosure 310 for the solenoid bank switching system 190 is shown. The enclosure 310 includes first and second cavities 420 and 430 that open to the second side of the enclosure 310. Opposite ends 426 and 436 of the first and second cavities 420 and 430 are closed. The enclosure 310 includes bores (or inlets) 414-1, 414-2, . . . , and 414-7 on the first side of the enclosure into the first cavity 420. The enclosure 310 includes bores 424-1, 424-2, . . . , and 424-7 from the first cavity 420 to the second cavity 430. The enclosure 310 includes bores (or outlets) 424-1, 424-2, . . . , and 424-5 from the second cavity 430 through the third side of the enclosure 310.

Figure 5A:
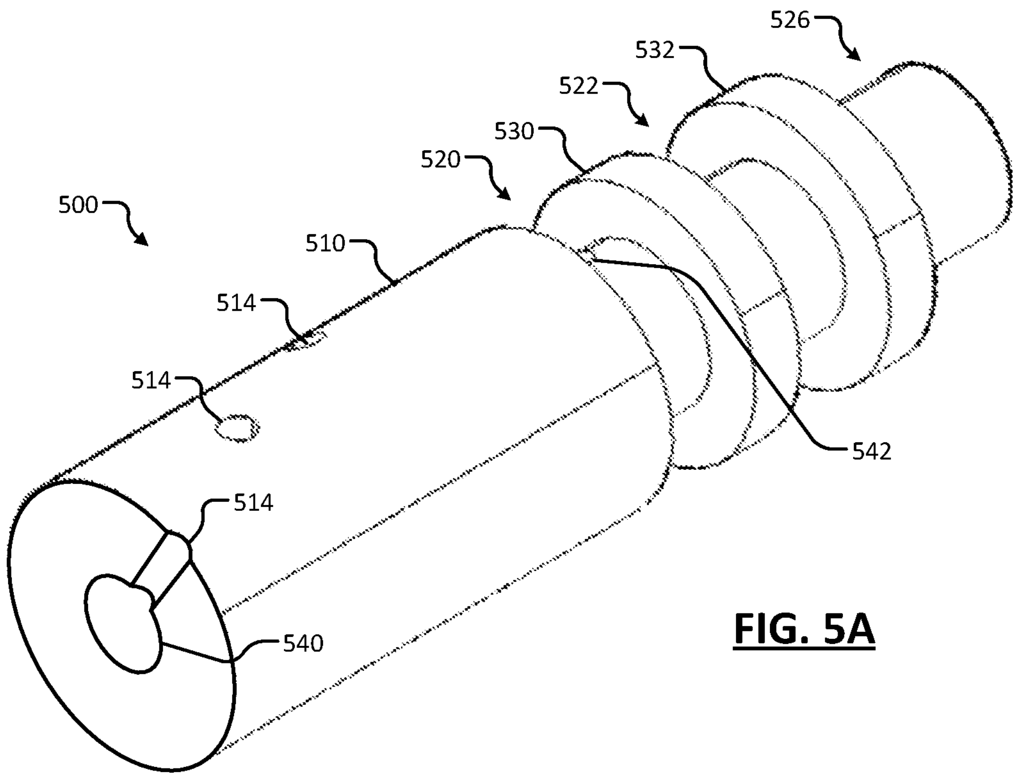
FIGS. 5A and 5B are partial perspective views of an example of shafts of the solenoid bank switching system according to the present disclosure.
Figure 5B:
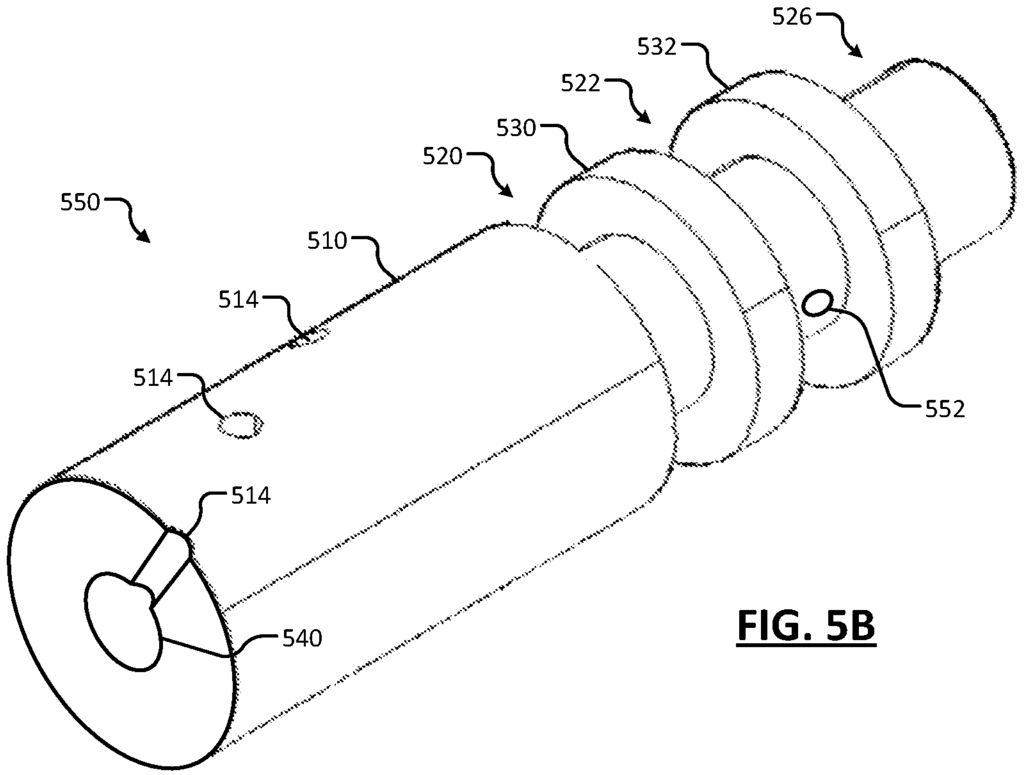

Referring now to FIGS. 5A and 5B, shafts 500 and 550 of the solenoid bank switching system 190 are shown. The shaft 500 includes first shaft portions 510, 530 and 532 having a larger diameter than second shaft portions 520, 522, and 526. The second shaft portion 520 is arranged between the first shaft portions 510 and 530. The second shaft portion 522 is arranged between the first shaft portions 530 and 532. The second shaft portion 526 extends axially from the first shaft portion 532. The shaft 500 includes a cavity 540 extending in an axial direction and M bores 514 extending outwardly from the cavity 540 at different angular positions. In some examples, the cavity 540 is axially aligned with the center of the shaft and the bores 514 extend in M different radial directions. While the shafts are shown with two different diameters, the shaft diameter can be a single diameter or more than two different diameters can be used.

In FIG. 5A, the second shaft portion 522 includes a bore 542 extending outwardly from the cavity 540 to a radially outer surface of the second shaft portion 520. In FIG. 5B, the shaft 550 is similar to the shaft 500. However, the second shaft portion 520 includes a bore 552 (rather than the bore 542 on the second shaft portion 522 as shown in FIG. 5A).

Figure 6A:
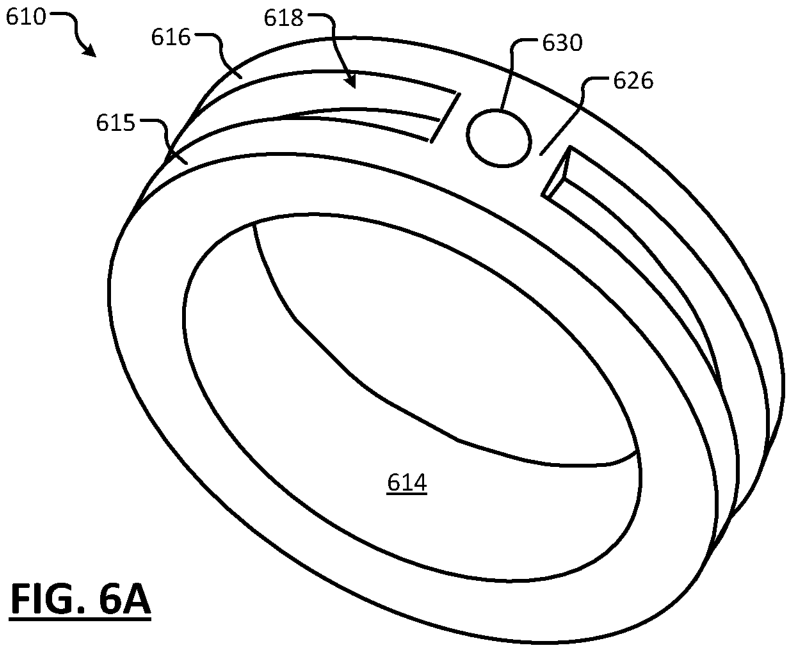
FIG. 6A is a perspective view of a sealing ring according to the present disclosure.

Referring now to FIG. 6A, sealing rings 610 are arranged around the first shaft portion 510 in the M locations where the bores 514 are located. The sealing ring 610 includes an annular body 614 with annular projections 615 and 616 (located on opposite sides of a central annular cavity 618) extending radially outwardly. The central annular cavity 618 extends almost entirely around the radially outer surface of the annular body 614. A blocking portion 626 has a similar diameter as the annular projections 615 and 616 and is arranged to block a portion of the central annular cavity 618. The blocking portion 626 includes a bore 630 extending radially inwardly and passing through the annular body 614. In some examples, the bores 514 and 630 have approximately the same diameters. The bores 630 of the sealing rings are aligned with the bores 514 of the shafts 500 or 550.

In some examples, the shaft 500 is arranged in the first cavity 420 and the shaft 550 is arranged in the second cavity 430. The bores 414-1 to 414-5 of the enclosure 310 are aligned with the central annular cavities 618 of the sealing rings 610. The bore 414-6 is aligned with the second shaft portion 520 between the first shaft portions 510 and 530. The bore 414-7 is aligned with the second shaft portion 522 between the first shaft portions 530 and 532.

An inner surface of the sealing rings 610 provides a fluid seal to the first shaft portion 510. An outer surface of the sealing rings 610 (e.g. the annular projections 615 and 616) provide a seal to inner diameters of the cavities 420 or 430. Fluid flows in the central annular cavity 618 when the bore 630 of the blocking portion 626 is misaligned with the bores or outlets 424 and/or 434. In other words, fluid flows around the sealing rings 610 in the central annular cavity 618 and through the bores or outlets 424 and/or 434. When the bore 630 of the blocking portion 626 is aligned with the bores or outlets 424 and/or 434, fluid in the central annular cavity 618 is blocked by the blocking portion 626 and fluid from the cavity 540 of the shaft 500 or 550 can flow through the bores or outlets 424 and/or 434.

In some examples, the sealing rings 610 have a higher frictional interface with the first shaft portions 510 as compared to a frictional interface with an inner diameter of the cavities 420 and 430 to allow rotation of the shafts 500 and 550 relative to the inner diameters of the cavities 420 and 430 without changing an angular position of the sealing rings 610 on the shafts 500 or 550. In some examples, splines, adhesive or pins are used to maintain the relative orientation of the sealing rings 610 relative to the shafts 500 or 550.

Figure 6B:
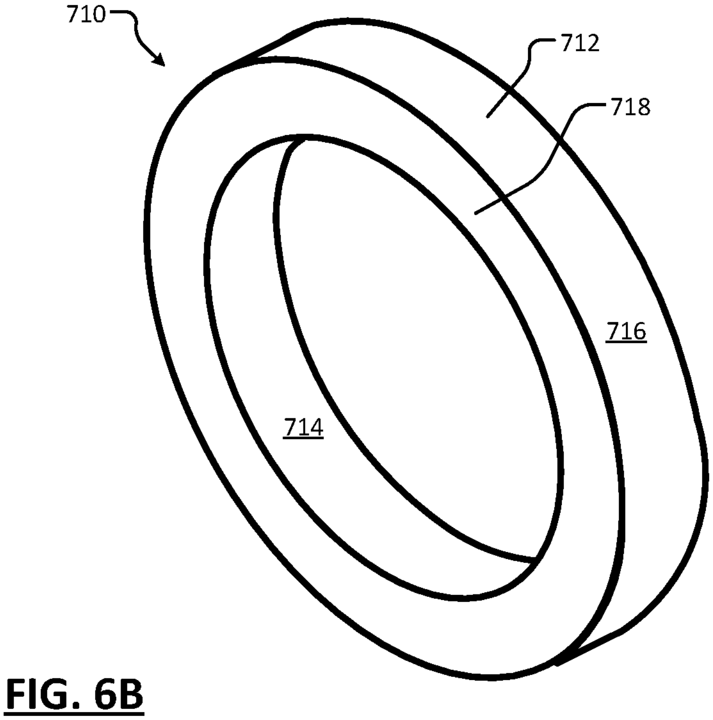
FIG. 6B is a perspective view of another sealing ring according to the present disclosure.

Referring now to FIG. 6B, an annular sealing ring 710 is shown to include an annular body 712 including an inner surface 714, an outer surface 716 and sides 718.

Figure 7:
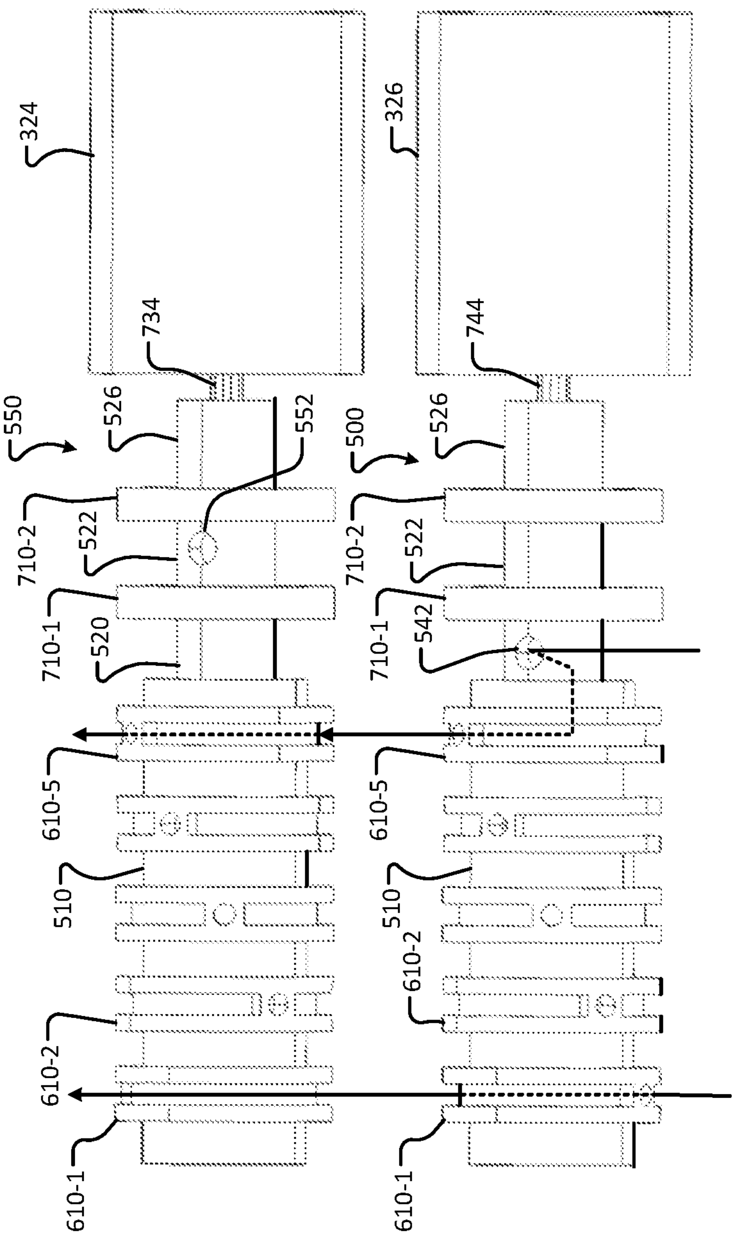
FIG. 7 is a plan view of an example of the shafts and sealing rings for the solenoid bank switching system according to the present disclosure.

Referring now to FIG. 7, the shafts 500 and 550 and a plurality of the sealing rings 610 for the solenoid bank switching system 190 are shown. Sealing rings 610-1, 610-2, . . . , and 610-5 are shown mounted on the first shaft portion 510 of the shafts 500 and 550. The sealing rings 610 are aligned with the bores 514. Annular sealing rings 710-1 and 710-2 are arranged on the first shaft portions 530 and 532, respectively, to ensure fluid flows into the bores 542 or 552. The motors 324 and 326 are connected by splined shafts 734 and 744 to the second shaft portions 526.

In the example shown in FIG. 7, fluid flow is shown in both solid and dotted lines. Solid lines represent fluid flowing around a front side of the sealing ring 610 and dotted lines represent fluid flowing around a back side of the sealing ring 610 or through the cavity 540 of one of the shafts 500 and 550. In this example, the solenoid valve associated with the solenoid valve/manifold assembly 314-1 is operating and the sealing ring 610-1 is rotated such that the blocking portion 626 is not aligned with the bore 414-1 or the bore 424-1 in FIG. 4. Since the blocking portion 626 of the sealing ring 610-1 is on the top side, the fluid flows around the back side of the sealing ring 610-1. The fluid flows through the bore 424-1, around the sealing ring 610-1 of the shaft 550 and though the bore 434-1 to the corresponding pneumatic valve 154-1.

The solenoid valve associated with the solenoid valve/manifold assembly 314-5 is not operating and one of the standby solenoid valves is configured to supply fluid. Fluid flows into the bore 542 and passes through the cavity 540 of the shaft 500 to a bore 514. Fluid flows out of the bore 630 in the blocking portion 626 of the sealing ring 610-5. Fluid flows through the bore 424-5, around a back side of the sealing ring 610-5 and through the bore 434-5 to supply the corresponding pneumatic value 154-5.

While not shown, when the standby solenoid valve associated with the standby solenoid valve/manifold assembly 316-2 delivers fluid, the fluid travels through the bore 414-7, around the second shaft portion 528 of the shaft 500, through the bore 424-7, around the second shaft portion of the shaft 550, into the bore 552, through the cavity 540 of the shaft 550 to one of the aligned sealing rings.

Figure 8:
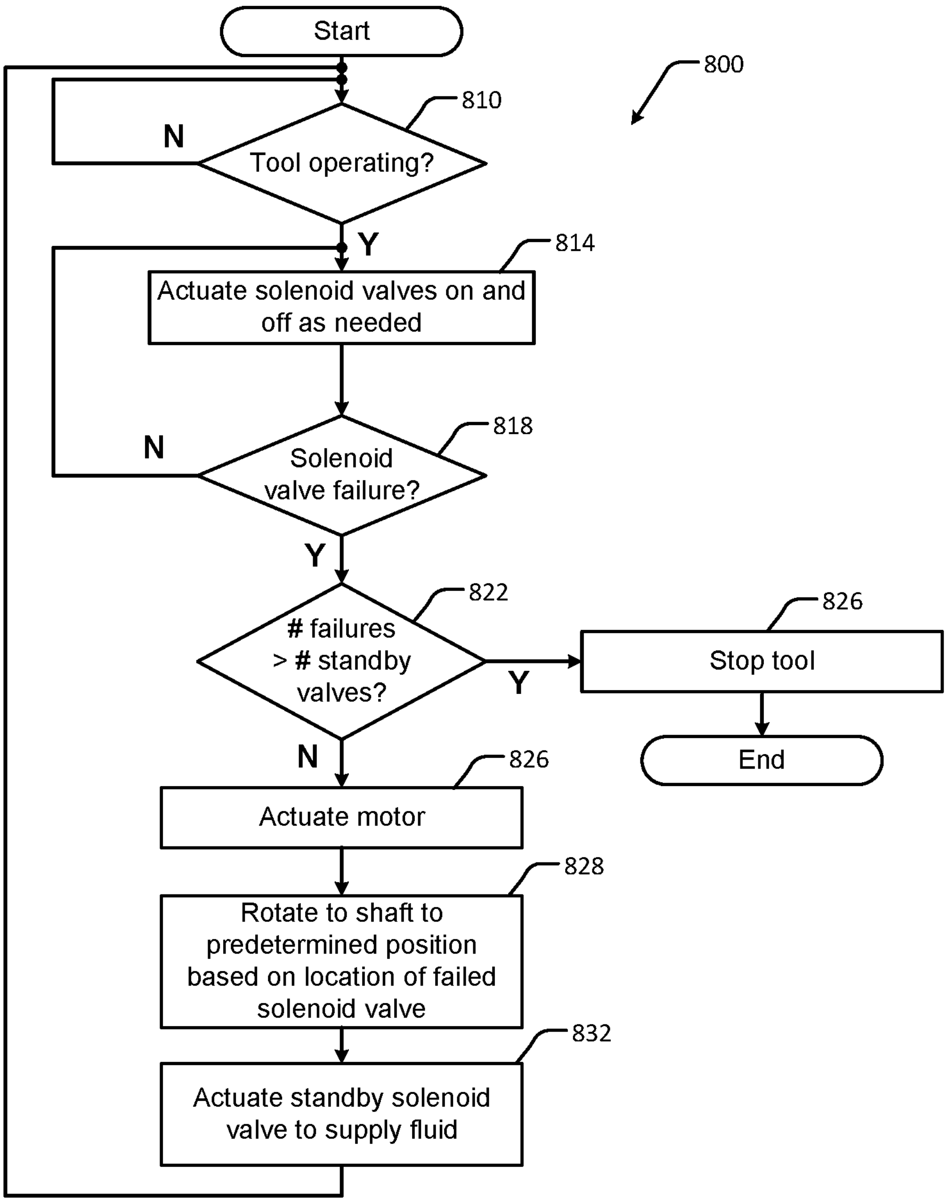
FIG. 8 is a flowchart of an example of a method for operating the solenoid bank switching system.

Referring now to FIG. 8, a flowchart 800 of an example of a method for operating the solenoid bank switching system is shown. At 810, the method determines whether the substrate processing tool is operating. If true, the method continues at 814 and actuates solenoid valves on and off as needed to actuate the corresponding pneumatic values. At 818, the method determines whether one of the solenoid valves has failed. If 818 is true, the method determines whether the number of failures is greater than the number of standby solenoid valves. If 822 is true, then operation of the tool is stopped.

If 822 is false, a corresponding one of the motors is actuated at 826 and rotated at 828 to align one of the shafts at 826 such that the blocking portion 626 and the bore 630 align with the bore 514 in the shaft as described above. At 832, the standby solenoid valve is actuated to supply fluid to control the pneumatic valve.

The solenoid bank switching system 190 increases uptime of the substrate processing system by detecting failures of the solenoid valves and switching in standby solenoid valves.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A fluid control system for a substrate processing system, comprising:

(M+N) inlets configured to fluidly connect to M solenoid valves and N standby solenoid valves, respectively, where M and N are integers greater than zero;

M outputs configured to be fluidly connected to M pneumatic valves; and a valve switching system comprising rotating shaft selectors, configured to:
selectively block 1 to N of the M inlets corresponding to 1 to N failed ones of M solenoid valves, respectively; and
supply fluid from 1 to N of the N standby solenoid valves to 1 to N of the M outputs corresponding to the 1 to N failed ones of M solenoid valves, respectively.

2. The fluid control system of claim 1, further comprising an enclosure including N cavities in fluid communication with the (M+N) inlets and the M outputs.

3. The fluid control system of claim 2, further comprising N shafts arranged in the N cavities, wherein each of the N shafts comprises:
a cylindrical body including first shaft portions having a first diameter and second shaft portions having a second diameter;
a cavity extending in an axial direction; and
M bores extending outwardly from the cavity to at least one of the first shaft portions at M different angles.

4. The fluid control system of claim 3, further comprising N motors to selectively rotate the N shafts, respectively.

5. The fluid control system of claim 4, further comprising a controller configured to:
monitor operation of the M solenoid valves;
determine when one of the M solenoid valves is not operating correctly; and
cause at least one of the N motors to rotate at least one of the N shafts to block fluid flow from the one of the M solenoid valves and supply fluid flow from one of the N standby solenoid valves.

6. The fluid control system of claim 3, further comprising M sealing rings arranged on the at least one of the first shaft portions at spaced axial locations corresponding to the M bores, respectively.

7. The fluid control system of claim 6, wherein each of the M sealing rings comprises:
an annular body; and
first and second annular projections extending radially outwardly on opposite axial sides of the annular body and configured to seal with an inner surface of one of the N cavities.

8. The fluid control system of claim 7, wherein each of the M sealing rings further comprises:
a blocking portion extending axially between the first and second annular projections;
a bore extending radially through the blocking portion; and
a central cavity extending around a radially outer surface of the annular body between the first and second annular projections and between opposite circumferential sides of the blocking portion.

9. The fluid control system of claim 8, wherein the bore of each of the M sealing rings is axially aligned with corresponding ones of the M bores.

10. The fluid control system of claim 9, wherein:
each of the N shafts further comprises a bore on at least one of the second shaft portions between adjacent ones of the first shaft portions; and
the bore is fluidly coupled to the cavity of each of the N shafts.

11. The fluid control system of claim 3, further comprising N blocking rings arranged at spaced axial locations on other ones of the first shaft portions.

12. A method for switching pneumatic valves in a substrate processing system, comprising:
connecting (M+N) inlets of a solenoid bank switching system to M solenoid valves and N standby solenoid valves, respectively, where M and N are integers greater than zero;
connecting M outlets of the solenoid bank switching system to M pneumatic valves;
monitoring operation of the M solenoid valves; and
in response to detecting one of the M solenoid valves has failed, using the solenoid bank switching system to cause one of N motors of the solenoid bank switching system to rotate one of N shafts of the solenoid bank switching system to:
block one of the (M+N) inputs corresponding to the failed one of the M solenoid valves; and
fluidly connect one of the N standby solenoid valves to one of the M outlets corresponding to the failed one of the M solenoid valves.

13. A system comprising:
(M+N) inlets configured to fluidly connect to M solenoid valves and N standby solenoid valves, respectively, where M and N are integers greater than zero;
M outputs configured to be fluidly connected to M pneumatic valves;
a valve switching system configured to:
selectively block 1 to N of the M inlets corresponding to 1 to N failed ones of M solenoid valves, respectively; and
supply fluid from 1 to N of the N standby solenoid valves to 1 to N of the M outputs corresponding to the 1 to N failed ones of M solenoid valves, respectively;
an enclosure including N cavities in fluid communication with the (M+N) inlets and the M outputs;
N shafts arranged in the N cavities; and
N motors to selectively rotate the N shafts, respectively.

14. The system of claim 13, wherein each of the N shafts comprises:
a cylindrical body including first shaft portions having a first diameter and second shaft portions having a second diameter;
a cavity extending in an axial direction; and
M bores extending outwardly from the cavity to at least one of the first shaft portions at M different angles.

15. The system of claim 14, further comprising M sealing rings arranged on the at least one of the first shaft portions at spaced axial locations corresponding to the M bores, respectively; wherein each of the M sealing rings comprises:
an annular body; and
first and second annular projections extending radially outwardly on opposite axial sides of the annular body and configured to seal with an inner surface of one of the N cavities.

16. The system of claim 15, wherein each of the M sealing rings further comprises:
a blocking portion extending axially between the first and second annular projections;
a bore extending radially through the blocking portion; and
a central cavity extending around a radially outer surface of the annular body between the first and second annular projections and between opposite circumferential sides of the blocking portion.

17. The system of claim 16, wherein the bore of each of the M sealing rings is axially aligned with corresponding ones of the M bores.

18. The system of claim 17, wherein:

each of the N shafts further comprises a bore on at least one of the second shaft portions between adjacent ones of the first shaft portions; and the bore is fluidly coupled to the cavity of each of the N shafts.

19. The system of claim 14, further comprising N blocking rings arranged at spaced axial locations on other ones of the first shaft portions.

20. The system of claim 13, further comprising a controller configured to:

monitor operation of the M solenoid valves;

determine when one of the M solenoid valves is not operating correctly; and cause at least one of the N motors to rotate at least one of the N shafts to block fluid flow from the one of the M solenoid valves and supply fluid flow from one of the N standby solenoid valves.

* * * * *